United States Patent
Sung et al.

(10) Patent No.: US 10,749,523 B2
(45) Date of Patent: Aug. 18, 2020

(54) SWITCH CIRCUIT AND MULTIPLEXER APPLYING THE SWITCH CIRCUIT

(71) Applicant: Realtek Semiconductor Corp., HsinChu (TW)

(72) Inventors: Ya-Hsuan Sung, Taipei (TW); Leaf Chen, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/407,176

(22) Filed: May 8, 2019

(65) Prior Publication Data

US 2020/0119729 A1    Apr. 16, 2020

(30) Foreign Application Priority Data

Oct. 12, 2018   (TW) .............................. 107135912 A (51) Int. Cl.
*H03K 17/687*    (2006.01)
(52) U.S. Cl.
CPC .................................. *H03K 17/687* (2013.01)
(58) Field of Classification Search
CPC .................................................. H03K 17/687
USPC ......................................................... 327/434
See application file for complete search history.

(56) References Cited

U.S. PATENT DOCUMENTS

| | | | | |
|---|---|---|---|---|
| 2003/0214343 | A1* | 11/2003 | Kato ................... | H03K 17/6872 327/334 |
| 2012/0062309 | A1* | 3/2012 | Hsi ........................ | H02J 7/0032 327/434 |
| 2014/0085761 | A1* | 3/2014 | Croft ................... | H03K 17/0822 361/91.5 |
| 2019/0068183 | A1* | 2/2019 | Lu ..................... | H03K 17/08122 |

* cited by examiner

*Primary Examiner* — Ryan Jager
(74) *Attorney, Agent, or Firm* — Winston Hsu (57) ABSTRACT

A switch circuit includes: a switching device control circuit receiving a first voltage and a second voltage, a first Type-I switching device coupled to the switching device control circuit and a first control voltage, a first Type-II switch element coupled to the switch control circuit and the first Type-I switch element, and a second Type-II switch element coupled to the first Type-I switch element and the first Type-II switch element. When the second voltage is higher than the first voltage, the switch control circuit turns on the first Type-II switch element in order to turn off the second Type-II switch element; and when the second voltage is higher than the first voltage, the first Type-I switch element is off.

20 Claims, 5 Drawing Sheets

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1− | $V_{BUS}$ | CC1 | D+ | D− | SBU1 | $V_{BUS}$ | RX2− | RX2+ | GND |
| GND | RX1+ | RX1− | $V_{BUS}$ | SBU2 | D− | D+ | CC2 | $V_{BUS}$ | TX2− | TX2+ | GND |
| B12 | B11 | B10 | B9 | B8 | B7 | B6 | B5 | B4 | B3 | B2 | B1 |

SWITCH CIRCUIT AND MULTIPLEXER APPLYING THE SWITCH CIRCUIT

BACKGROUND OF THE INVENTION

1. Field of the Invention

The present invention relates to a switch circuit and a multiplexer which utilizes the switch circuit, and more particularly, to a leakage-proof and high-voltage durable switch circuit and associated multiplexer.

2. Description of the Prior Art

Figure 1:
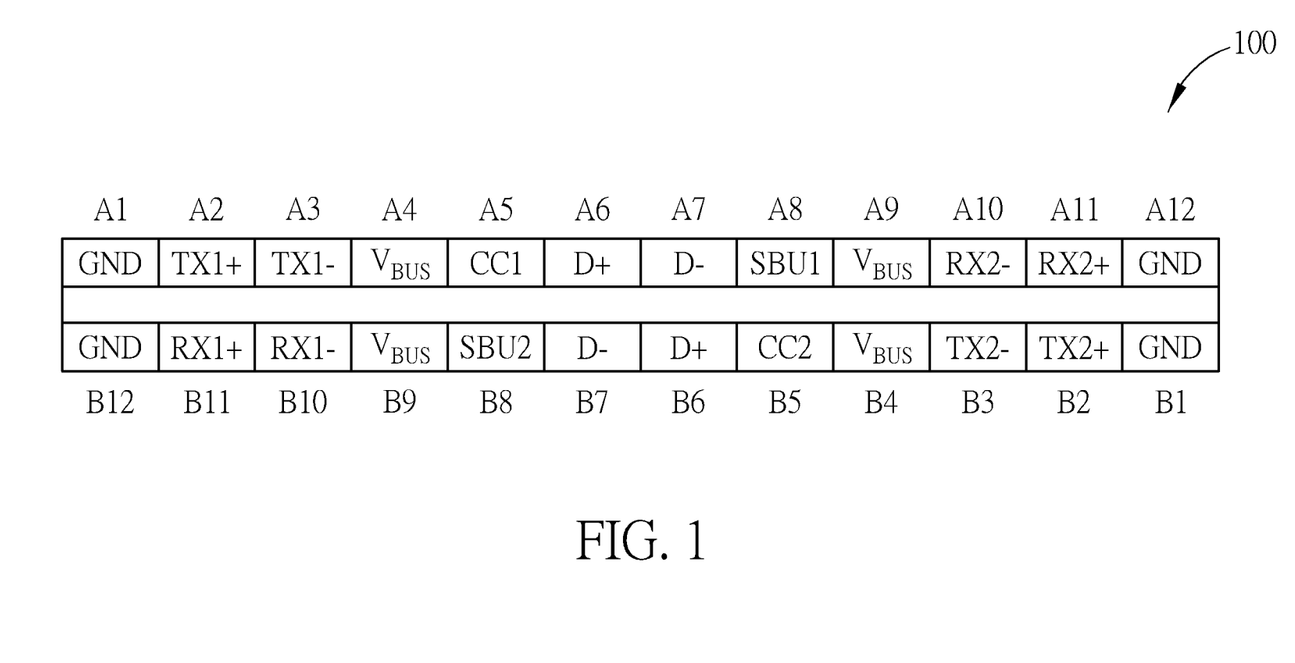
FIG. 1 is a diagram illustrating an example of related art Type_C connector.

In recent applications of electronic devices, the use of the Type_C connector has become more prevalent. Please refer to FIG. 1 which is a diagram illustrating an example of related art Type_C connector. As shown in FIG. 1, the Type_C connector 100 comprises a plurality of pins such as VBUS, SBU_1, SBU_2, etc. The pin VBUS is arranged to receive a high voltage. The wrong connection of pins of the Type_C connector 100 or humidity could be the main reason that makes the pin VBUS short-circuited with the pin SBU_1 or SBU_2. Hence, the circuit connecting to the pins SBU_1 and SBU_2 must have a high-voltage durable mechanism. In addition, the circuit connecting to the pins SBU_1 and SBU_2 must have a high-voltage durable mechanism is preferably to have an anti-leakage mechanism to prevent the leakage under all kinds of conditions.

To support the both-side insertion of the Type_C connector, an inner multiplexer is often utilized to connect to the pins SBU_1, SBU_2 and other circuits (such as the IC inside the smartphone). However, this type of multiplexer in general is not designed with consideration of anti-leakage and high-voltage durable issues.

SUMMARY OF THE INVENTION

Therefore, an objective of the present invention is to provide a switch circuit with anti-leakage and high voltage characteristics.

Another objective of the present invention is to provide a multiplexer with anti-leakage and high voltage characteristics.

An embodiment of the present invention discloses a switch circuit, which comprises a switching device control circuit, a first Type-I switching device, a first Type-II switch element and a second Type-II switch element. The switching device control circuit is configured to receive a first voltage and a second voltage. The first Type-I switching device comprises a first terminal coupled to the switching device control circuit, and a second terminal for receiving a first control voltage, wherein the first control voltage is associated with the first voltage. The first Type-II switch element comprises a first terminal coupled to the switch control circuit, and a second terminal coupled to the first terminal of the first Type-I switch element. The second Type-II switch element comprises a first terminal coupled to the first terminal of the first Type-I switch element, and a second terminal coupled to a third terminal of the first Type-II switch element. When the second voltage is higher than the first voltage, the switch control circuit makes the first Type-II switch element turned on, and conducting of the first Type-II switch element causes non-conducting of the second Type-II switch element; and when the second voltage is higher than the first voltage and the first voltage is a first predetermined voltage, the first Type-I switch element is non-conducting.

An embodiment of the present invention discloses a multiplexer which comprises a plurality of input terminals, a plurality of output terminals and a plurality of switch circuits. The conduction states of the switch circuits determine the electrical connecting manner between the input terminals and the output terminals. At least one of the switch circuits of this embodiment comprises all elements of the switch circuit of the previous embodiment.

According to the aforementioned embodiments, the switch circuit of the present invention may provide a robust leakage-proof mechanism, wherein high-voltage durable elements or resistors with high resistance may be added to further improve the leakage-proof mechanism. One thing should be noted is that the solution provided by the present invention is not limited to only solving the aforementioned problems.

These and other objectives of the present invention will no doubt become obvious to those of ordinary skill in the art after reading the following detailed description of the preferred embodiment that is illustrated in the various figures and drawings.

DETAILED DESCRIPTION

The following uses several embodiments to introduce the concepts of the present invention. Please note that the terms "first" and "second " are used to distinguish the elements independent from each other, and are not used to represent the quantity, order or location of the elements. For example, the first NMOS and the second NMOS are simply not the same NMOS, which does not suggest that the first NMOS must be introduced prior to the second NMOS.

Figure 2:
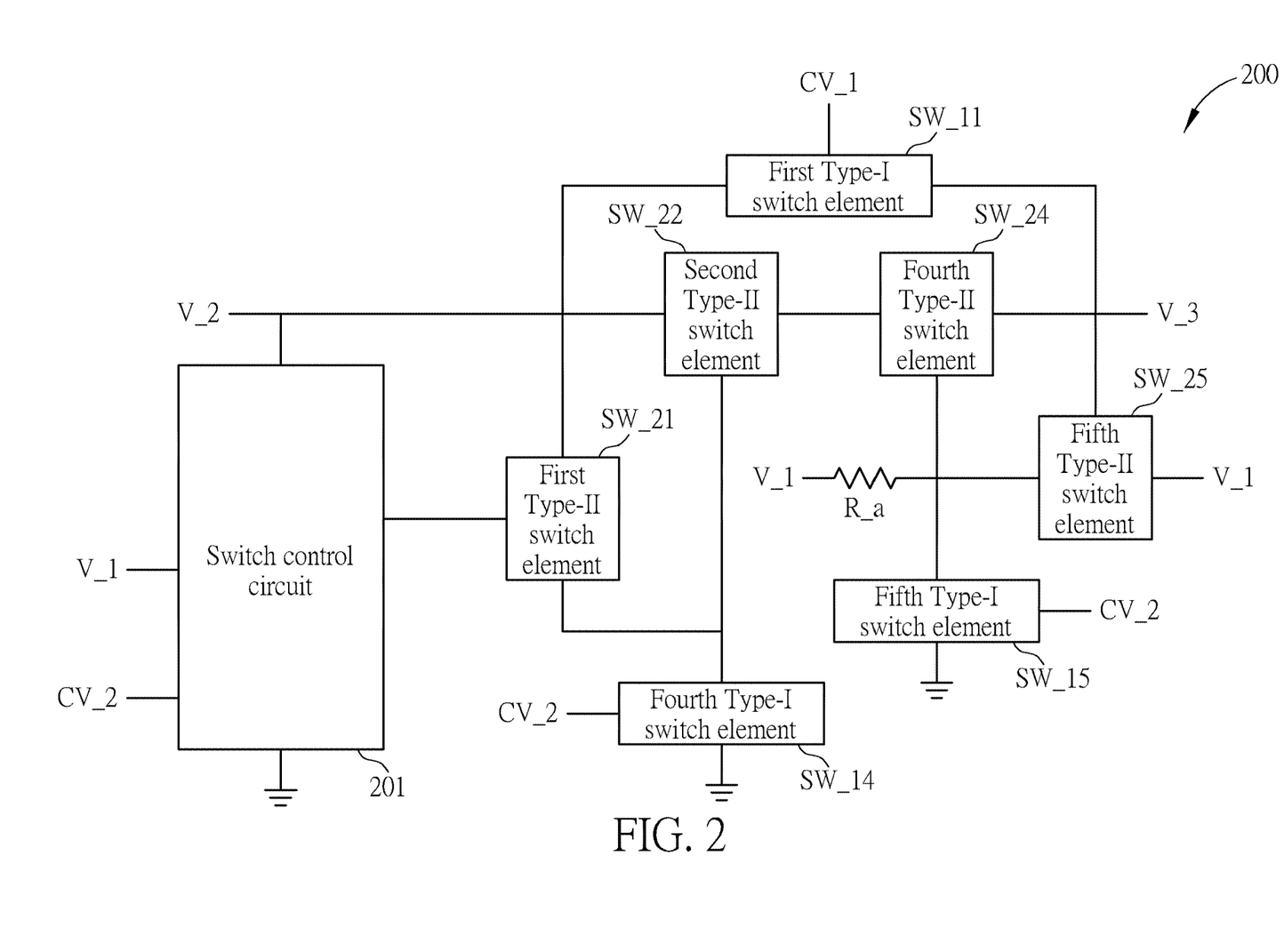
FIG. 2 is a block diagram illustrating a switch circuit according to an embodiment of the present invention.

FIG. 2 is a block diagram illustrating a switch circuit according to an embodiment of the present invention. The switch circuit 200 comprises a switch control circuit 201, a first Type-I switch element SW_11, a first Type-II switch element SW_21, a second Type-II switch element SW_22, a fourth Type-I switch element SW_14, a fifth Type-I switch element SW_15, a fourth Type-II switch element SW_24, a fifth Type-II switch element SW_25 and resistor R_a.

The switch control circuit 201 receives a first voltage V_1 and a second voltage V_2. The first Type-I switch element SW_11 comprises a first terminal coupled to switch control circuit 201 and a second terminal for receiving the first control voltage CV_1, wherein the first control voltage CV_1 is associated with the first voltage V_1, e.g. the first control voltage CV_1 may be positively correlated with the first voltage V_1. The first Type-II switch element SW_21 comprises a first terminal coupled to the switch control circuit 201, a second terminal coupled to the first terminal of the first Type-I switch element SW_11. The second Type-II switch element SW_22 comprises a first terminal coupled to the first terminal of the first Type-I switch element SW_11, and a second terminal coupled to the third terminal of the first Type-II switch element SW_21. The fourth Type-II switch element SW_24 comprises a first terminal coupled to the third terminal of the second Type-II switch element SW_22, and a third terminal coupled to the second terminal of the first Type-I switch element SW_11 and the third voltage V_3. The fifth Type-II switch element SW_25 comprises a first terminal coupled to the third voltage V_3, and a second terminal coupled to first voltage V_1. A first terminal of the resistor R_a is coupled to the third terminal of the fourth Type-II switch element SW_24 and the third terminal of the fifth Type-II switch element SW_25; and a second terminal of the resistor R_a is coupled to the first voltage V_1.

The first voltage V_1 may be the system voltage (e.g. the voltage required by the switch circuit 200 to operate a Type_C connector), and the control voltage CV_1 is a voltage associated with the first voltage V_1. For example, when the first voltage V_1 is zero, the control voltage CV_1 will also be zero. The second voltage V_2 maybe the voltage at the pin SBU (e.g. SBU+ or SBU− that mentioned in the example of FIG. 1). The third voltage V_3 may be the voltage provided by the circuit or device coupled to the switch circuit 201. The following embodiment will illustrate based on the above example, but the first voltage V_1, second voltage V_2 and third voltage V_3 are not limited to what have been described in the above example. The detailed definitions of those voltages may be modified based on the electronic device or circuit that employs the switch circuit.

The following will use different embodiments to illustrate the operations of the switch circuit 201 shown in FIG. 2. One thing should be noted is that the first voltage V_1, second voltage V_2 and third voltage V_3 in these embodiments are merely for illustrative purposes, and are not meant to limit the present invention to use mentioned values only. As long as the relationship between the first voltage V_1, second voltage V_2 and third voltage V_3 is able to present same or similar effect, modifications to the values or parameters shall fall within the scope of the present invention. For example, in an modification, the first voltage V_1 may be 0V and the second voltage V_2 may be 3.3V. Since it conforms to the condition where the second voltage V_2 is higher than first voltage V_1, this modification falls within the scope of the present invention.

In some circumstances, the first voltage V_1 may be 0V, the second voltage V_2 may be higher than a predetermined voltage (e.g. 3.3V or 20V) of the first voltage V_1, and the third voltage V_3 may be 0V. For example, the switch circuit 200 maybe used for the Type_C connector. However, when the Type_C connector is just powered on, the Type_C connector has not yet operated at the system voltage and does not receive voltage from other circuit or device. In this situation, the switch control circuit 201 may receive the second voltage V_2 to make the first Type-II switch element SW_21 turned on, and the conducting state of the first Type-II switch element SW_21 will make the second Type-II switch element SW_22 non-conducting, thus preventing the second voltage V_2 from leaking from the second Type-II switch element SW_22. In addition, since the first voltage V_1 is 0V, and the first control voltage CV_1 is associated with the first voltage V_1, the value of the first control voltage CV_1 will be 0 or a low voltage, thus making the first Type-I switch element SW_11 non-conducting. Please note that the first voltage V_1 can be replaced with a non-zero first predetermined voltage that is unable to turn on the first Type-I switch element SW_11 (e.g. 3.3V), thus preventing the second voltage V_2 from leaking from the first Type-I switch element SW_11.

In some circumstances, the first voltage V_1 may be 0V, the second voltage V_2 may be 0V, and the third voltage V_3 may be 3.3V. For example, when the switch circuit 200 is used for the Type_C connector, the Type_C connector may receive power from a circuit or device connected thereto, but the pin SUB thereof cannot receive voltage. In this situation, the third voltage V_3 may utilize the fifth Type-II switch element SW_25 to make the fourth Type-II switch element SW_24 non-conducting, and thus prevents the third voltage V_3 from leaking from the fourth Type-II switch element SW_24.

In an embodiment, the first voltage V_1 may be 3.3V, the second voltage V_2 may be 0V, and the third voltage V_3 may be 3.3V. For example, when the switch circuit 200 is used for the Type_C connector, the Type_C connector may receive the power from the circuit or device connected thereto, but the pin SUB thereof cannot receive any voltage. In this situation, the first voltage V_1 may make the fourth Type-II switch element SW_24 non-conducting via the resistor R_a, thus preventing the third voltage V_3 from leaking from the fourth Type-II switch element SW_24.

In an embodiment, the switch circuit 200 may further comprise a fourth Type-I switch element SW_14 which has: a first terminal coupled to the third terminal of the first Type-II switch element SW_21, a second terminal coupled to a second predetermined voltage (e.g. the ground voltage), and a third terminal coupled to a second control voltage CV_2. In this embodiment, the switch circuit 100 may further comprise a fifth Type-I switch element SW_15 which comprises: a first terminal coupled to the third terminal of the fourth Type-II switch element SW_24, a second terminal coupled to the second predetermined voltage (e.g. the ground voltage), and a third terminal coupled to a second control voltage CV_2. The switch control circuit 201 receives the second control voltage CV_2. When the second control voltage CV_2 makes the fourth Type-I switch element SW_14 and the fifth Type-I switch element SW_15 turned on, the switch control circuit 201 will be turned off. On the contrary, when the second control voltage CV_2 makes the fourth Type-I switch element SW_14 and the fifth Type-I switch element SW_15 non-conducting, the switch control circuit 201 will normally operate.

In an embodiment, when the switch circuit 200 does not normally operate (which means signals cannot be delivered to the IC of the third voltage V_3 from the pin SBU for providing the second voltage V_2), the second control voltage CV_2 will make the switch control circuit 201 operate, and meanwhile, make the fourth Type-I switch element SW_14 and fifth Type-I switch element SW_15 non-conducting. In this situation, the aforementioned leakage prevention operation will be activated. On the contrary, when the switch circuit 200 is able to normally operate (which means signals can now be directly delivered from the pin SBU of the second voltage V_2 to the IC of the third voltage V_3), the second control voltage CV_2 will make the switch control circuit 201 turned off, and make the fourth Type-I switch element SW_14 and fifth Type-I switch element SW_15 turned on.

One thing should be noted is that the switch circuit provided by the present invention is not limited to definitely comprise all elements shown in FIG. 2. Based on different anti-leakage requirements, the switch circuit may only comprise a portion of the elements in FIG. 2.

The following will illustrate examples of the detailed architecture of the elements in FIG. 2. One thing should be noted is that the actual applied elements are not limited by the embodiment of FIG. 2. As long as same or similar result can be achieved, modifications based on the above architecture shall fall within the scope of the present invention.

Figure 3:
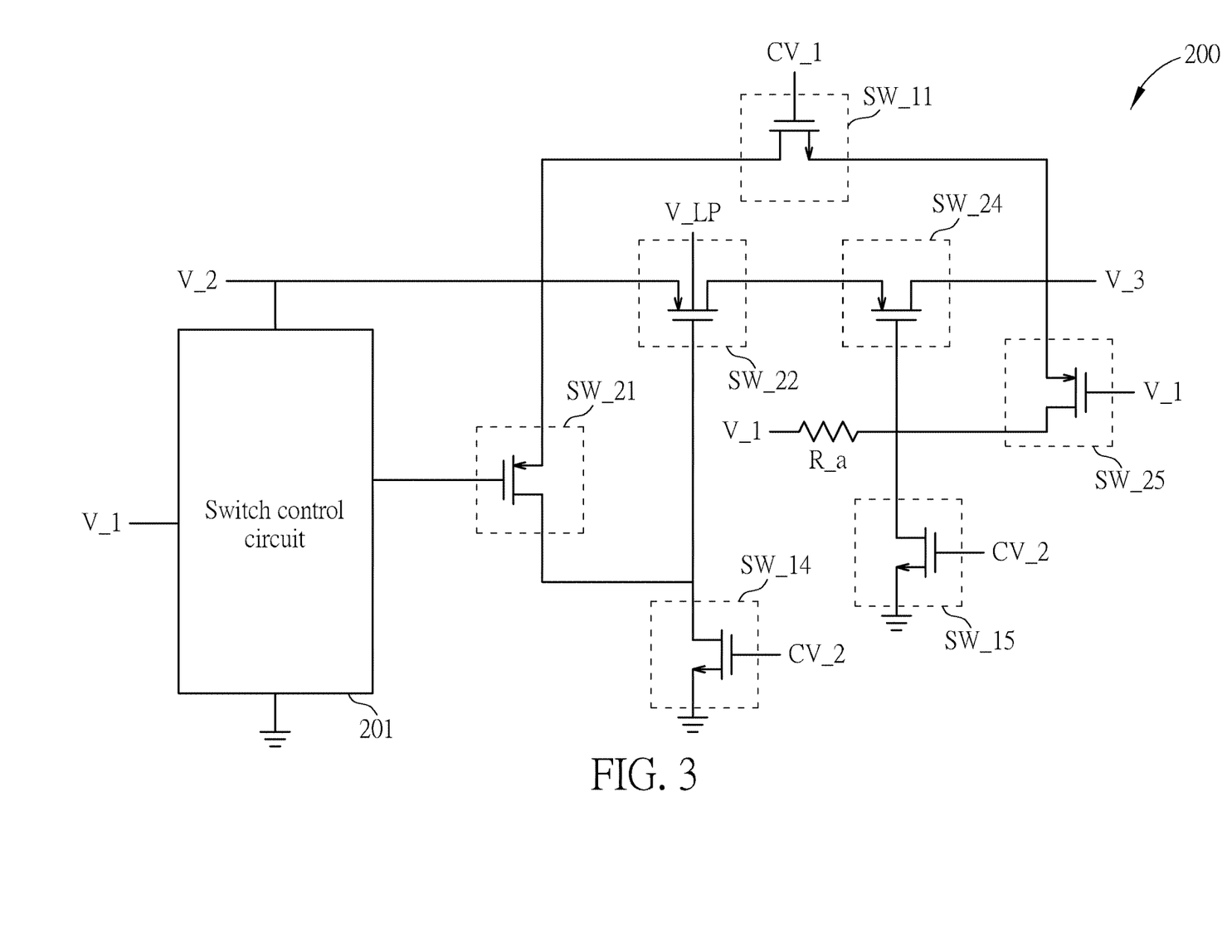
FIG. 3 is a diagram illustrating a switch circuit according to an embodiment of the present invention.

FIG. 3 is a diagram illustrating a switch circuit according to an embodiment of the present invention. As shown in FIG. 3, the first Type-II switch element SW_21 is a PMOS, and the gate, source and drain thereof may serve as the first, second and third terminals of the aforementioned first Type-II switch element SW_21 respectively. The second Type-II switch element SW_22 is also PMOS, and the source and gate thereof may serve as the first and second terminals of the aforementioned second Type-II switch element SW_22, respectively. The first Type-I switch element SW_11 is an NMOS, the drain and gate of the first Type-I switch element SW_11 may serve as the first and second terminals of the aforementioned first Type-I switch element SW_11, respectively.

In the aforementioned situation where the first voltage V_1 is 0V, the second voltage V_2 is a predetermined voltage higher than the first voltage V_1 (e.g. the second voltage V_2 may be 3.3V or 20V) and the third voltage V_3 is 0V, the switch control circuit 201 will pull down the gate voltage of the first Type-II switch element SW_21 in order to turn on the first Type-II switch element SW_21 and thereby make the gate-to-source voltage VGS of the second Type-II switch element SW_22 be 0 so that the second Type-II switch element SW_22 is non-conducting. When the first control voltage CV_1 is relatively small, (e.g. 0 or a voltage that is slightly higher than 0), the first Type-I switch element SW_11 will be non-conducting. As mentioned above, the first voltage V_1 maybe replaced by a non-zero first predetermined voltage that is unable to turn on the first Type-I switch element SW_11 (e.g. 3.3V).

In the aforementioned situation where the first voltage V_1 is 0V, the second voltage V_2 is 0V, and the third voltage V_3 is 3.3V, the third voltage V_3 will pull up the gate voltage of the fourth Type-II switch element SW_24 via the fifth Type-II switch element SW_25. Hence, the gate-to-drain voltage VGD of the fourth Type-II switch element SW_24 will be 0, making the fourth Type-II switch element SW_24 non-conducting. Moreover, in the situation where the first control voltage CV_1 is small (0 or a low voltage slightly larger than 0), the first Type-I switch element SW_11 will be non-conducting.

In the situation where the first voltage V_1 is 3.3V, the second voltage V_2 is 0V and the third voltage V_3 is 3.3V, the first voltage V_1 will pull up the gate voltage of the fourth Type-II switch element SW_24 via the resistor R_1. Hence, the third voltage V_3 will not leak from the fourth Type-II switch element SW_24. The first control voltage CV_1 corresponding to the first voltage V_1 is not large enough to turn on the first Type-I switch element SW_11, and thus the first voltage V_1 will not leak from the first Type-I switch element SW_11.

Figure 4:
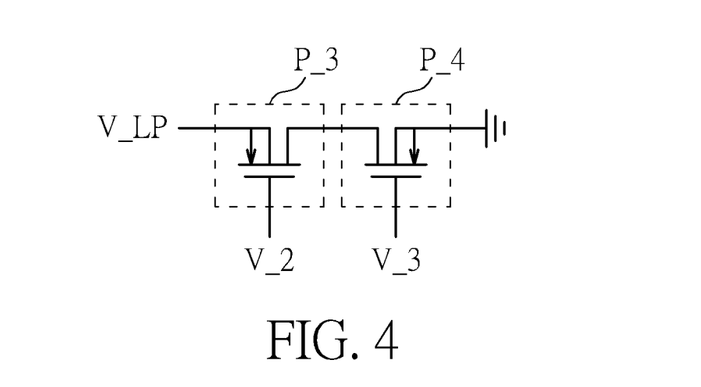
FIG. 4 is a diagram illustrating a voltage providing circuit according to an embodiment of the present invention.

In order to prevent the second voltage V_2 from leak via the body of the second Type-II switch element SW_22, the switch circuit 200 may comprise a voltage providing circuit which is configured to provide an anti-leakage voltage V_LP to the body of the second Type-II switch element SW_22. As shown in FIG. 4, the voltage providing circuit 400 comprises serially coupled PMOS P_3 and PMOS P_4 that are respectively coupled to the second voltage V_2 and the third voltage V_3 for providing the anti-leakage voltage V_LP. However, the voltage providing circuit is not limited to the example of FIG. 4.

Figure 5:
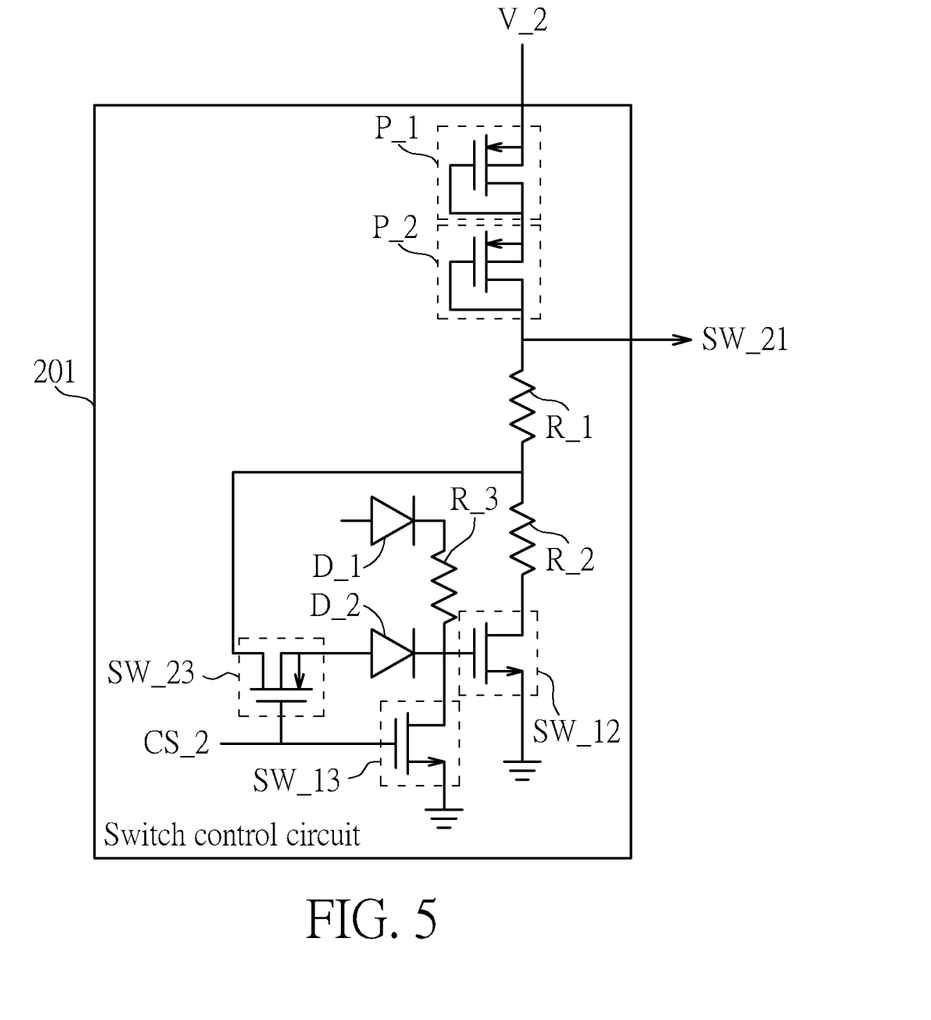
FIG. 5 is a diagram illustrating the switch control circuit shown in FIG. 2 and FIG. 3 according to an embodiment of the present invention.

FIG. 5 is a diagram illustrating the switch control circuit 201 shown in FIG. 2 and FIG. 3 according to an embodiment of the present invention. As shown in FIG. 5, the switch control circuit 201 comprises a first PMOS P_1, a second PMOS P_2, a resistor series (comprising the resistors R_1 and R_2 in this embodiment), a second Type-I switch element SW_12, a third Type-I switch element SW_13 and a third Type-II switch element SW_23.

The first PMOS P_1 comprises a source coupled to the second voltage V_2, and a drain and gate that are short-circuited to each other. The source of the second PMOS P_2 is coupled to the drain of the first PMOS P_1, the drain and gate of the second PMOS P_2 are short-circuited, and the drain of the second PMOS P_2 is coupled to the resistor series and the gate of the first Type-II switch element SW_21. The first PMOS P_1 and the second PMOS P_2 may serve as a voltage adjusting circuit, which utilize the source-to-gate voltage VSG thereof to reduce the second voltage V_2 in order to generate an adjustment voltage, and thereby provide anti-leakage effects. However, the present invention is not limited to the above. As long as the effect of reducing the voltage for the first PMOS P_1 and the second PMOS P_2 can be achieved, some modified circuits shall fall within the scope of the present invention. Under the situation where the second voltage V_2 is larger than a specific value and the switch control circuit 201 normally operates (e.g. the aforementioned 3.3V), the adjustment voltage may turn on the second Type-I switch element SW_12 via the resistor R_1 and the third Type-II switch element SW_23.

The first terminal of the second Type-I switch element SW_12 is coupled to the resistor series, and the second terminal of the second Type-I switch element SW_12 is coupled to a second predetermined voltage (e.g. the ground voltage). The third Type-II switch element SW_23 comprises a first terminal coupled between the resistors (e.g. the resistor R_1 and resistor R_2) of the resistor series, a second terminal coupled to the second Type-I switch element SW_12, and a third terminal for receiving the aforementioned second control voltage CS_2. The third Type-I switch element SW_13 comprises a first terminal coupled to the second Type-I switch element SW_12, a second terminal coupled to the third terminal of the third Type-II switch element SW_23, and a third terminal coupled to the second predetermined voltage (e.g. the ground voltage).

In an embodiment, the second Type-I switch element SW_12 may be an NMOS element, and the source, drain and gate thereof may serve as the first, second and third terminals of the second Type-I switch element SW_12 respectively. In this embodiment, the third Type-II switch element SW_23 maybe a PMOS, and the drain, source and gate thereof may serve as the first, second and third terminals of the third Type-II switch element SW_23, respectively. the third Type-I switch element SW_13 may be an NMOS, and the drain, gate and source thereof may serve as the first terminal, the second terminal and third terminal of the third Type-I switch element SW_13, respectively.

In the embodiment of FIG. 5, under the situation where the first voltage V_1 is 0V, the second voltage V_2 is a predetermined voltage (e.g. 3.3V or 20V) higher than the first voltage V_1 and the third voltage V_3 is 0V, due to the drain-to-gate voltage of the first PMOS P_1 and the second PMOS P_2, the second voltage V_2 will be reduced and an adjustment voltage will be generated at the source of the second PMOS P_2. The adjustment voltage may turn on the second Type-I switch element SW_12 via the resistor R_1 and the third Type-II switch element SW_23. The conducting state of the second Type-I switch element SW_12 will pull down the gate voltage of the first Type-II switch element SW_21 and thereby turn on the Type-II switch element SW_21, which makes the second Type-II switch element SW_22 in FIG. 3 non-conducting (as mentioned above). In the embodiment of FIG. 5, the switch control circuit 201 may further comprise at least one diode such as the diodes D_1 and D_2 which may control the direction of current, or a resistor R_3 which may control the magnitude of current, but the present invention is not limited thereto.

Both the aforementioned switch element or PMOS may be implemented with high-voltage durable elements in order to make the switch element circuit have high-voltage durable characteristics, and the aforementioned resistor may be implemented with high resistance, making the anti-leakage function more robust. Further, the aforementioned embodiment can be modified without being limited by the elements shown in the figure. After viewing the above contents, one skilled in the art should be readily to know how to only use a portion of the circuit to achieve similar effects. Such kind of modifications made to the above embodiments shall fall within the scope of the present invention.

Figure 6:
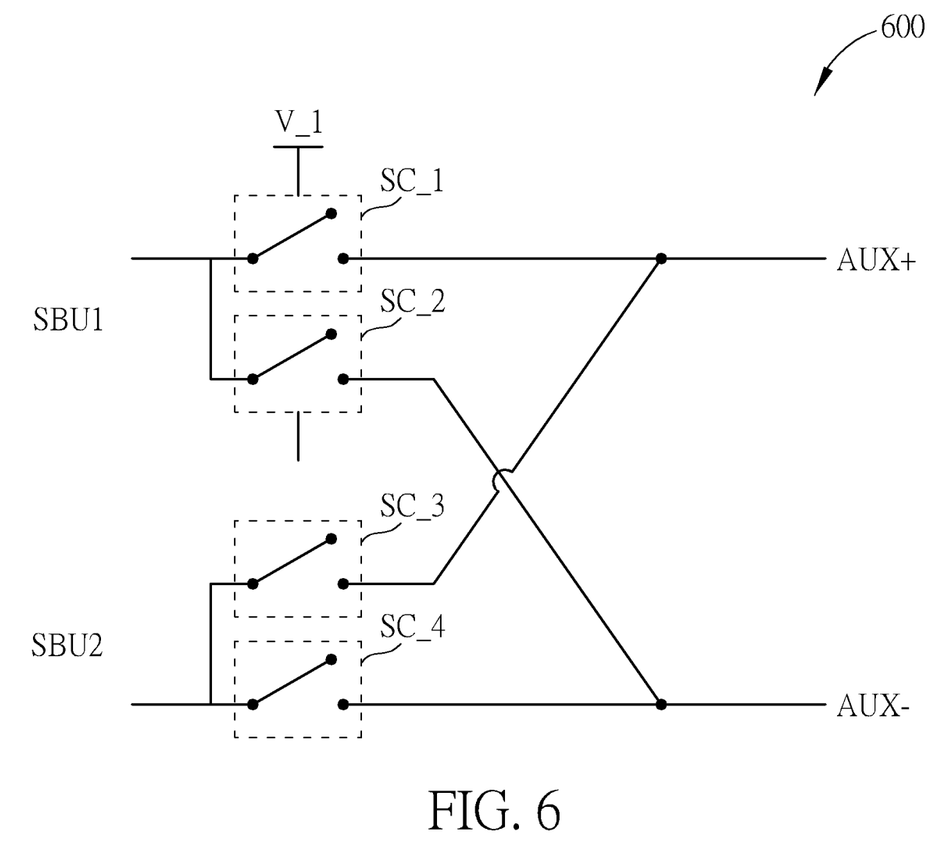
FIG. 6 is a diagram illustrating an exemplary application of the switch circuit shown in FIG. 2.

FIG. 6 is a diagram illustrating an exemplary application of the switch circuit shown in FIG. 2. In this embodiment, the aforementioned switch circuit is applied in a multiplexer. As shown in FIG. 6, the multiplexer 600 comprises multiple switch circuits SC_1-SC_4 (wherein SBU_1 and SBU_2 are SBU pins), which may provide the aforementioned second voltage V_2, and AUX+ and AUX− represent the connecting terminals of another circuit a device, which may provide the aforementioned third voltage V_3. Each of the switch circuits SC_1-SC_4 may comprise at least one portion of the aforementioned switch circuit embodiment. The aforementioned first voltage V_1 is the system voltage required for operating the multiplexer 600.

However, the switch circuit of the present invention is not limited to only applied to the multiplexer of the architecture shown in FIG. 6, instead, maybe applied to multiplexers having a plurality of input terminals and a plurality of output terminals. In other words, a multiplexer that utilizes the switch circuit of the present invention may comprise a plurality of switch circuits, a plurality of input terminals and a plurality of output terminals, wherein the conduction state of the switch circuit determines the electrical connection manner between the input terminals and the output terminals.

According to the aforementioned contents, the multiplexer 600 may refer to the conducting or non-the conducting state of the switch circuit SC_1-SC_4 to determine the connection manner between AUX+, AUX− and SBU_1 and SBU_2, in order to realize the both-side insertion of the Type_C connector. With the aid of the aforementioned anti-leakage mechanism, the switch circuit provided by the present invention may have the anti-leakage function under any circumstance.

According to the embodiment mentioned above, the switch circuit provided by the present invention presents a robust anti-leakage mechanism, and may be implemented with high-voltage durable element and a resistor with high resistance to further optimize the anti-leakage ability. One thing should be noted is that the solution provided by the present invention is not limited to solve the problem encountered in the related art only.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch circuit, comprising:
   a switch control circuit, configured to receive a first voltage and a second voltage;
   a first Type-I switching device, comprising a first terminal coupled to the switch control circuit, and a second terminal for receiving a first control voltage, wherein the first control voltage is associated with the first voltage;
   a first Type-II switch element, comprising a first terminal coupled to the switch control circuit, and a second terminal coupled to the first terminal of the first Type-I switch element; and
   a second Type-II switch element, comprising a first terminal coupled to the first terminal of the first Type-I switch element, and a second terminal coupled to a third terminal of the first Type-II switch element;
   wherein when the second voltage is higher than the first voltage, the switch control circuit makes the first Type-II switch element turned on, and conducting of the first Type-II switch element causes the second Type-II switch element non-conducting; and when the second voltage is higher than the first voltage and the first voltage is a first predetermined voltage, the first Type-I switch element is non-conducting.

2. The switch circuit of claim 1, wherein the first Type-II switch element is a PMOS, a gate, a source and a drain of the first Type-II switch element serves as the first terminal, the second terminal and the third terminal of the first Type-II switch element, respectively.

3. The switch circuit of claim 2, wherein the second Type-II switch element is a PMOS, a source and a gate of the second Type-II switch element serves as the first terminal and the second terminal of the second Type-II switch element, respectively.

4. The switch circuit of claim 1, wherein the switch control circuit comprises:
   a second Type-I switch element, comprising a first terminal coupled to a second predetermined voltage;
   a voltage adjusting circuit, configured to reduce the second voltage in order to generate an adjustment voltage; and
   a resistor series, serially coupled between a second terminal of the second Type-I switch element and the voltage adjusting circuit.

5. The switch circuit of claim 4, wherein the voltage adjusting circuit comprises:
   a first PMOS, comprising a source coupled to the second voltage, and a drain, gate which are short circuited;
   a second PMOS, wherein a source of the second PMOS is coupled to the drain of the first PMOS, a drain and a gate of the second PMOS are short-circuited, and the drain of the second PMOS is coupled to the resistor series;
   wherein the second Type-I switch element is an NMOS, a source and a drain of the second Type-I switch element serves as the first terminal and the second terminal of the second Type-I switch element, respectively.

6. The switch circuit of claim 4, wherein the resistor series comprises multiple resistors, and the switch circuit further comprises:
    a third Type-II switch element, comprising a first terminal coupled between the resistors of the resistor series, a second terminal coupled to the second Type-I switch element, and a third terminal for receiving a second control voltage; and
    a third Type-I switch element, comprising a first terminal coupled to the second Type-I switch element, a second terminal coupled to the third terminal of the third Type-II switch element, and a third terminal coupled to the second predetermined voltage.

7. The switch circuit of claim 6, wherein:
    the third Type-II switch element is a PMOS, and a drain, a source and a gate of the third Type-II switch element serves as the first terminal, the second terminal and the third terminal of the third Type-II switch element, respectively; and
    the third Type-I switch element is a NMOS, and a drain, a gate and a source of the third Type-I switch element serves as the first terminal, the second terminal and the third terminal of the third Type-I switch element, respectively.

8. The switch circuit of claim 1, further comprising:
    a fourth Type-I switch element, comprising a first terminal coupled to the third terminal of the first Type-II switch element, a second terminal coupled to a second predetermined voltage, and a third terminal coupled to a second control voltage;
    wherein the switch control circuit also receives the second control voltage, and when the second control voltage makes the fourth Type-I switch element turned on, the switch control circuit is thereby turned off.

9. The switch circuit of claim 1, further comprising:
    a fourth Type-II switch element, comprising a first terminal coupled to a third terminal of the second Type-II switch element, a second terminal coupled to a third terminal of the first Type-I switch element and a third voltage; and
    a fifth Type-II switch element, comprising a first terminal coupled to the third voltage, and a second terminal coupled to the first voltage;
    wherein when the third voltage is larger than or equal to the first voltage, the third voltage makes the fourth Type-II switch element non-conducting via the fifth Type-II switch element.

10. The switch circuit of claim 9, further comprising:
    a resistor, comprising a third terminal coupled to the fourth Type-II switch element, a first terminal coupled to a third terminal of the fifth Type-II switch element, and a second terminal coupled to the first voltage;
    wherein when the first voltage and the third voltage is larger than the second voltage, the first voltage makes the fourth Type-II switch element non-conducting via the resistor.

11. A multiplexer, comprising:
    a plurality of input terminals;
    a plurality of output terminals; and
    a plurality of switch circuits, conduction states of the switch circuits determine the electrically conducting manner between the input terminals and the output terminals;
    wherein at least one of the switch circuits comprises:
        a switch control circuit, configured to receive a first voltage and a second voltage;
        a first Type-I switch element, comprising a first terminal coupled to the switch control circuit, and a second terminal for receiving a first control voltage, wherein the first control voltage is associated with the first voltage;
        a first Type-II switch element, comprising a first terminal coupled to the switch control circuit, a second terminal coupled to the first terminal of the first Type-I switch element; and
        a second Type-II switch element, comprising a first terminal coupled to the first Type-I switch element the first terminal, and a second terminal coupled to a third terminal of the first Type-II switch element;
    wherein when the second voltage is higher than the first voltage, the switch control circuit turns on the first Type-II switch element, and conducting of the first Type-II switch element makes the second Type-II switch element non-conducting; and when the second voltage is higher than the first voltage and the first voltage is a first predetermined voltage, the first Type-I switch element is non-conducting.

12. The multiplexer of claim 11, wherein the first Type-II switch element is a PMOS, and a gate, a source and a drain of the first Type-II switch element serves as the first terminal, the second terminal and the third terminal of the first Type-II switch element, respectively.

13. The multiplexer of claim 12, wherein the second Type-II switch element is a PMOS, and a source and a gate of the second Type-II switch element serves as the first terminal and the second terminal of the second Type-II switch element, respectively.

14. The multiplexer of claim 11, wherein the switch control circuit comprises:
    a second Type-I switch element, comprising a first terminal coupled to a second predetermined voltage;
    a voltage adjusting circuit, configured to reduce the second voltage in order to generate an adjustment voltage; and
    a resistor series, serially coupled between a second terminal of the second Type-I switch element and the voltage adjusting circuit.

15. The multiplexer of claim 14, wherein the voltage adjusting circuit comprises:
    a first PMOS, comprising a source coupled to the second voltage, and short-circuited drain and gate;
    a second PMOS, wherein a source of the second PMOS is coupled to the drain of the first PMOS, a drain and a gate of the second PMOS are short-circuited, and the drain of the second PMOS is coupled to the resistor series;
    wherein the second Type-I switch element is a NMOS, a source and a drain of the second Type-I switch element serves as the first terminal and the second terminal of the second Type-I switch element, respectively.

16. The multiplexer of claim 14, wherein the resistor series comprises multiple resistors, and the switch circuit further comprises:
    a third Type-II switch element, comprising a first terminal coupled between the resistors of the resistor series, a second terminal coupled to the second Type-I switch element, and a third terminal for receiving a second control voltage; and
    a third Type-I switch element, comprising a first terminal coupled to the second Type-I switch element, a second terminal coupled to the third terminal of the third Type-II switch element, and a third terminal coupled to the second predetermined voltage.

17. The multiplexer of claim 16, wherein:
the third Type-II switch element is a PMOS, and a drain, a source and a gate of the third Type-II switch element serves as the first terminal, the second terminal and the third terminal of the third Type-II switch element, respectively; and
the third Type-I switch element is a NMOS, and a drain, a gate and a source of the third Type-I switch element serves as the first terminal, the second terminal and the third terminal of the third Type-I switch element, respectively.

18. The multiplexer of claim 11, further comprising:
a fourth Type-I switch element, comprising a first terminal coupled to the third terminal of the first Type-II switch element, a second terminal coupled to a second predetermined voltage, and a third terminal coupled to a second control voltage;
wherein the switch control circuit also receives the second control voltage, and when the second control voltage makes the fourth Type-I switch element turned on, the switch control circuit is thereby turned off.

19. The multiplexer of claim 11, further comprising:
a fourth Type-II switch element, comprising a first terminal coupled to a third terminal of the second Type-II switch element, a second terminal coupled to a third terminal of the first Type-I switch element and a third voltage; and
a fifth Type-II switch element, comprising a first terminal coupled to the third voltage, and a second terminal coupled to the first voltage;
wherein when the third voltage is larger than or equal to the first voltage, the third voltage makes the fourth Type-II switch element non-conducting via the fifth Type-II switch element.

20. The multiplexer of claim 19, further comprising:
a resistor, comprising a third terminal coupled to the fourth Type-II switch element, a first terminal coupled to a third terminal of the fifth Type-II switch element, and a second terminal coupled to the first voltage;
wherein when the first voltage and the third voltage is larger than the second voltage, the first voltage makes the fourth Type-II switch element non-conducting via the resistor.

* * * * *